United States Patent [19]

Manocha et al.

[11] Patent Number: 5,084,415
[45] Date of Patent: Jan. 28, 1992

[54] METALLIZATION PROCESSING

[75] Inventors: Ajit S. Manocha, Allentown; Virendra V. S. Rana, South Whitehall Township, Lehigh County, both of Pa.

[73] Assignee: AT&T Bell Laboratories, Murray Hill, N.J.

[21] Appl. No.: 425,642

[22] Filed: Oct. 23, 1989

[51] Int. Cl.⁵ .............................................. H01L 21/44
[52] U.S. Cl. .................................. 437/189; 437/192; 437/190; 437/245
[58] Field of Search ............... 437/189, 192, 190, 245, 437/187

[56] References Cited

U.S. PATENT DOCUMENTS

| | | | |
|---|---|---|---|
| 4,404,235 | 9/1983 | Tarng et al. | 437/245 |
| 4,845,050 | 7/1989 | Kim et al. | 437/192 |

FOREIGN PATENT DOCUMENTS

| | | | |
|---|---|---|---|
| 0267730 | 5/1988 | European Pat. Off. | 437/192 |
| 62-219945 | 9/1987 | Japan . | |
| 2181456 | 4/1987 | United Kingdom . | |

OTHER PUBLICATIONS

"Thin Film Processes", John Vossen et al., 1987.
"Thin Layers of Tin and Al as glue layers for blanket Tungsten Deposition", 1987, Materials Research Society, pp. 187–195, Rana et al.
"Tungsten on Conducting Nitride Composite Film", IBM Technical Disclosure Bulletin; Aha et al., 8/88, pp. 477–478.

*Primary Examiner*—Brian E. Hearn
*Assistant Examiner*—Trung Dang
*Attorney, Agent, or Firm*—R. D. Laumann

[57] ABSTRACT

When forming a metallization layer in integrated-circuit semiconductor device fabrication, metal such as tungsten, for example, adheres poorly to dielectrics such as, e.g., silicon oxide, and tends to flake off from wafer areas not covered by a glue layer- such areas typically including the backside and the edge of the wafer, and clip marks on the face of the wafer. The invention prevents flaking by processing including: forming an adhesive or glue layer on the dielectric, forming a metal layer, forming a protective layer on metal on the glue layer, and etching to remove metal not covered by the protective layer.

21 Claims, 1 Drawing Sheet

METALLIZATION PROCESSING

TECHNICAL FIELD

The invention is concerned with the manufacture of integrated-circuit devices comprising a metallization.

BACKGROUND OF THE INVENTION

The manufacture of integrated-circuit devices such as, e.g., semiconductor memory and logic chips involves numerous processing steps including ion implantation, deposition of dielectric and conductor layers on a wafer substrate, and photolithographic patterning and etching. More particularly with respect to the deposition of conductor layers on a dielectric, such layers may be formed, e.g., by (physical) sputtering or by chemical vapor deposition (CVD), the former being in current use for aluminum, and the latter for tungsten. In the following, attention is directed primarily to the formation, by chemical vapor deposition, of a metallization layer on a dielectric.

One difficulty encountered in this connection arises from typically unsatisfactory adhesion, e.g., of CVD-tungsten to the dielectric, making it advisable, prior to metal deposition, to form an auxiliary, adhesion-enhancing "glue" layer. Since such glue layer is typically deposited by sputtering onto the face of a wafer while the wafer's edge is held by chips, the wafer back side, the wafer edge, and small areas of the wafer face underlying the clips ("clip marks") remain essentially as uncoated dielectric. As a result, subsequently deposited CVD-tungsten material tends to flake off from such uncoated areas in the coarse of further processing, thereby contaminating processing apparatus and interfering with desired processing.

The invention described below is motivated by the desired to prevent metal flake-off and attendant contamination and interference.

SUMMARY OF THE INVENTION

A metallization layer is formed on a substrate which at least in part is covered with a dielectric surface layer. Preferred processing includes forming an adhesive or glue layer on the dielectric, forming a metal layer, forming a protective layer on a portion of the metal layer, and etching to remove metal not covered by the protective layer.

DETAILED DESCRIPTION

Figure 1:
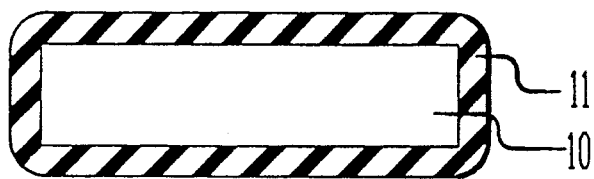
FIGS. 1-5 are schematic cross-sectional views of an integrated-circuit wafer structure at sequential exemplary stages of processing in accordance with a preferred embodiment of the invention.

FIG. 1 shows wafer substrate 10 covered with layer 11 which consists of a dielectric material such as, e.g., a silicon oxide, $SiO_x$, $0 < x \leq 2$, borosilicate glass, phosphosilicate glass, or borophosphosilicate glass. Silicon oxide may have been formed by deposition, using reagents such as, e.g., silane or tetraehylorthosilicate (TEOS), the latter being particularly suitable also in combination with trimethylborate (TMB) and/or trimethylphosphite (TMP) for forming deposits commonly known as BTEOS, PTEOS and BPTEOS. Suitable further as silicon-oxide organic precursors are diethylsilane, tetramethylcyclotetrasiloxane (TMCTS), diacetoxyditertiarybutoxysilane (DADBS), diacetoxydiisopropoxysilane (DADIS), and tritertiarybutoxyethoxysilane (TBES), including their derivatives. Other than of a material based on silicon oxide, dielectric layer 11 may consist of silicon nitride or silicon oxynitride, for example.

Substrate 10 is understood to comprise, at one surface, semiconductor device structures as typically arranged to fit into "chip" regions, to be physically separated later. Semiconductor device structures may comprise regions of doped silicon, contacts to such regions, as well as metal-oxide-semiconductor (MOS) gate structures, Furthermore, the dielectric layer which overlies device regions is typically provided with openings or windows for the sake of electric access to contacts.

Figure 2:
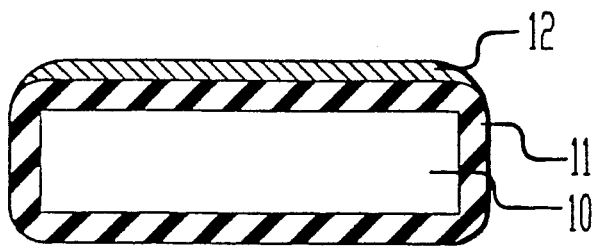

Further to features depicted in FIG. 1, FIG. 2 shows glue layer 12 on the device side of substrate 10. For example, in the case of tungsten as a metallization material, layer 12 may comprise titanium, titanium nitride, titanium-tungsten, titanium-aluminum, titanium-vanadium, titanium-yttrium, or polycrystalline silicon; preferred deposition is by sputtering.

Figure 3:
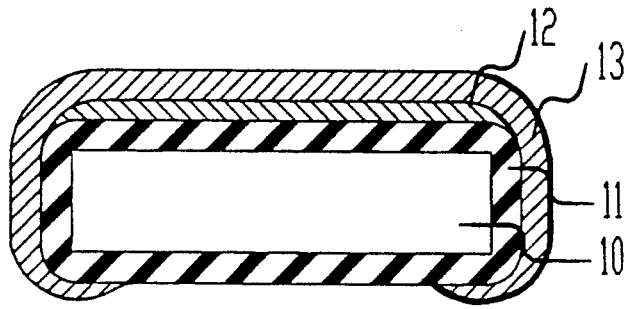

Further to features depicted in FIG. 2, FIG. 3 shows metallization layer 13, consisting, e.g., of tungsten, copper, or aluminum. Alloyed metallizations are not precluded.

Figure 4:
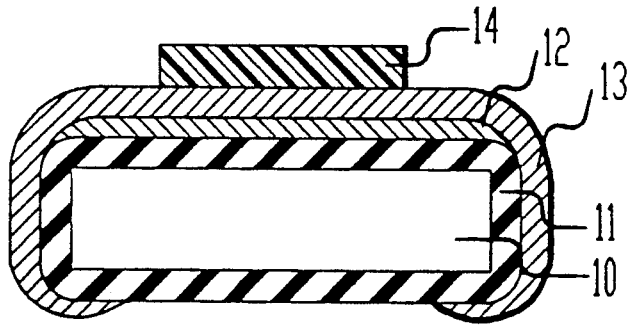

Further to features depicted in FIG. 3, FIG. 4 shows protective layer 14, typically consisting of polymeric material. Conveniently, such material may be a resist material as typically used for photolithographic patterning of metallization layers. Protective-layer material may be spun on, and, preferably, removed by localized rinsing or wiping from a peripheral region 111 to allow for clip marks. Conveniently, peripheral region 111 is a circumferential region whose width x is chosen adequate for this purpose.

Figure 5:
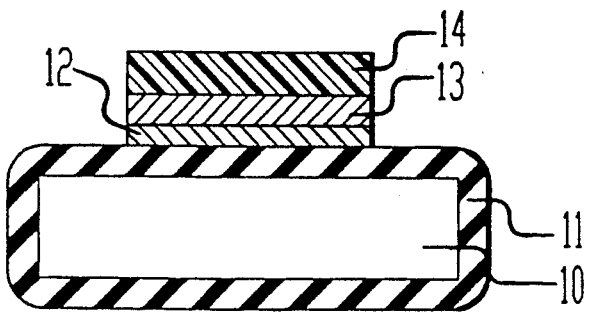

FIG. 5 shows the assembly of FIG. 4 after (isotropic, wet) etching, such etching causing removal of the metallization from surface areas not covered by protective layer 14. In the case of tungsten as a metallization material, for example, etching may be effected, e.g., by exposure to photoresist developer or other KOH-based solvent that does not attack unexposed photoresist material. Typically, as depicted, etching further results in removal of adhesive layer material; this will be the case, e.g., when tungsten is deposited on a titanium-tungsten adhesive layer. However, such removal of the adhesive layer is not essential at this point, as remaining adhesive material does not tend to flake off.

Further processing may involve photographic exposure of resist layer 14, developing the resist layer to form a pattern, and transferring the developed pattern into metallization layer 13 by etching. Alternatively, in cases where metal is deposited for forming electric-connection "plugs" in windows, for example, layer 14 may be stripped, and etching of layer 13 may proceed, e.g., as disclosed by N. S. Tsai et al., "Layer Tungsten and its Applications for VLSI Interconnects", *IEDM Technical Digest*, 1988, pp. 462-465. In either case of further processing, remaining adhesive material will be removed at this point.

Exemplary preferred processing of the invention as described above may be compared with alternatively contemplated processing involving, e.g., sputter deposition of a glue layer on the entirety of layer 11 (front, back, and edge of the wafer) prior to metal deposition. With respect to such sputter deposition it is observed that over-all deposition of a glue layer is hampered by the need to turn the wafer over for exposure of its back side, by difficulties in covering the wafer edge, and by the need to repeat the glue-layer deposition process with the wafer rotated for the sake of coating the clip marks. It is apparent, by contrast, that preferred processing of the invention is not subject to such difficulties.

We claim:

1. In the manufacture of integrated-circuit devices, a method for forming a metal layer on a dielectric layer on a substrate comprising a semiconductor-device face, characterized by forming an adhesive layer on said dielectric, forming a metal layer in part on said adhesive layer and in part on said dielectric, forming a protective layer on portions of said metal layer on the adhesive layer, said protective layer does not cover a peripheral region of said face, and etching to remove metal not covered by the protective layer.

2. The method of claim 1 in which said peripheral region is circumferential.

3. The method of claim 1 in which forming said peripheral region comprises rinsing.

4. The method of claim 1 in which forming said peripheral region comprises wiping.

5. The method of claim 1 in which etching is by wet etching.

6. The method of claim 1 in which said metal comprises tungsten.

7. The method of claim 1 in which said metal comprises copper.

8. The method of claim 1 in which said metal comprises aluminum.

9. The method of claim 1 in which said dielectric comprises silicon oxide.

10. The method of claim 9 in which said dielectric further comprises boron.

11. The method of claim 9 in which said dielectric further comprises phosphorus.

12. The method of claim 9 in which said dielectric further comprises boron and phosphorus.

13. The method of claim 1 in which said dielectric comprises silicon nitride.

14. The method of claim 1 in which said dielectric comprises silicon oxynitride.

15. The method of claim 1 in which said metal is selected from the group consisting of tungsten and copper, in which said dielectric comprises a silicon oxide, and in which said adhesive layer comprises a material selected from the group consisting of titanium, titanium nitride, titanium-tungsten, titanium-aluminum, titanium-vanadium, titanium-yttrium, and polysilicon.

16. The method of claim 1 in which said protective layer comprises a polymeric material.

17. The method of claim 16 in which said polymeric material is a photoresist material.

18. The method of claim 17 in which etching comprises exposure to photoresist developer.

19. The method of claim 1 in which said metal is deposited by chemical vapor deposition.

20. The method of claim 1, further comprising lithographic patterning of said protective layer and corresponding etching of said metal layer.

21. In the manufacture of integrated-circuit devices, a method for forming a metal layer on a dielectric layer on a wafer comprising a semiconductor-device face, characterized by forming an adhesive layer on the dielectric overlying semiconductor-device structures, forming a metal layer in part on said adhesive layer and in part on said dielectric, forming a protective layer on a position of said metal layer on the adhesive layer, and etching to remove metal from an area comprising the backside and the edge of said wafer, and clip marks on the face of said wafer, thereby preventing metal from flaking off said area.

* * * * *

UNITED STATES PATENT AND TRADEMARK OFFICE
CERTIFICATE OF CORRECTION

PATENT NO. : 5,084,415
DATED : January 28, 1992
INVENTOR(S) : Ajit S. Manocha, Virendra V. S. Rana It is certified that error appears in the above-identified patent and that said Letters Patent is hereby corrected as shown below:

Column 4, line 35, claim 21, "position" should read --portion--.

Signed and Sealed this

Twenty-seventh Day of April, 1993

Attest:

MICHAEL K. KIRK

Attesting Officer

Acting Commissioner of Patents and Trademarks